United States Patent
Tanno et al.

(10) Patent No.: US 11,144,032 B2
(45) Date of Patent: Oct. 12, 2021

(54) TIME TO FAILURE ANALYSIS OF ROBOTIC ARM CABLING

(71) Applicant: Fanuc Corporation, Yamanashi (JP)

(72) Inventors: Yoshihiro Tanno, Yamanashi (JP);
Akihiro Oikawa, Yamanashi (JP);
Toshinori Ohashi, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 157 days.

(21) Appl. No.: 16/169,329

(22) Filed: Oct. 24, 2018

(65) Prior Publication Data
US 2019/0129381 A1  May 2, 2019

(30) Foreign Application Priority Data

Oct. 30, 2017 (JP) .............................. JP2017-209166

(51) Int. Cl.
| | | |
|---|---|---|
| *G05B 19/4065* | (2006.01) | |
| *B25J 9/16* | (2006.01) | |
| *B25J 19/00* | (2006.01) | |
| *G01R 31/58* | (2020.01) | |
| *B25J 13/06* | (2006.01) | |
| *B25J 19/06* | (2006.01) | |

(Continued)

(52) U.S. Cl.
CPC ........ *G05B 19/4065* (2013.01); *B25J 9/1674* (2013.01); *B25J 13/06* (2013.01); *B25J 19/0025* (2013.01); *B25J 19/0095* (2013.01); *B25J 19/06* (2013.01); *G01R 31/58* (2020.01); *G05B 13/048* (2013.01); *G05B 23/0283* (2013.01); *G05B 2219/37254* (2013.01)

(58) Field of Classification Search
CPC .............. G05B 19/4065; G05B 13/048; G05B 23/0283; G05B 2219/37254; G01R 31/58; B25J 9/1674; B25J 19/0025; B25J 19/0095; B25J 19/06
USPC ......................................................... 73/799
See application file for complete search history.

(56) References Cited

U.S. PATENT DOCUMENTS 5,083,284 A * 1/1992 Kato ....................... G01B 7/00
702/34
2006/0289395 A1  12/2006 Nomizu et al.
(Continued)

FOREIGN PATENT DOCUMENTS

| CN | 107121926 A | 9/2017 |
|---|---|---|
| JP | 63103993 U | 7/1988 |

(Continued)

OTHER PUBLICATIONS

Translation KR-20090105679-A (Year: 2009).*
(Continued)

*Primary Examiner* — Alexander A Mercado
*Assistant Examiner* — Monica S Young
(74) *Attorney, Agent, or Firm* — RatnerPrestia

(57) ABSTRACT

A life prediction apparatus is configured to accurately predict a life of a cable wired at a joint part of a robot. The life prediction apparatus includes a fatigue-level estimation unit for estimating a fatigue level of the cable based on encoder information of an actuator which moves the joint part of the robot, and a life prediction unit for predicting the life of the cable based on a fatigue level of the cable estimated by the fatigue-level estimation unit and an allowable value of the cable.

5 Claims, 7 Drawing Sheets

(51) Int. Cl.
  *G05B 13/04* (2006.01)
  *G05B 23/02* (2006.01)

(56) References Cited

U.S. PATENT DOCUMENTS

| | | | | |
|---|---|---|---|---|
| 2007/0149328 | A1* | 6/2007 | Townsend | F16H 19/005 |
| | | | | 474/101 |
| 2011/0202308 | A1* | 8/2011 | Kishida | G01D 5/2449 |
| | | | | 702/151 |
| 2013/0151214 | A1* | 6/2013 | Ryou | G05B 19/404 |
| | | | | 703/2 |
| 2014/0358279 | A1* | 12/2014 | Kimoto | B25J 19/0025 |
| | | | | 700/245 |
| 2016/0263710 | A1* | 9/2016 | Yoshida | B23K 9/133 |
| 2017/0032281 | A1* | 2/2017 | Hsu | G06N 5/04 |
| 2017/0293862 | A1* | 10/2017 | Kamiya | G01N 29/14 |

FOREIGN PATENT DOCUMENTS

| | | | |
|---|---|---|---|
| JP | 02198792 | A | 8/1990 |
| JP | 9-81215 | A | 3/1997 |
| JP | 2002-56726 | A | 2/2002 |
| JP | 2002260459 | A | 9/2002 |
| JP | 2006309588 | A | 11/2006 |
| JP | 2007-7673 | A | 1/2007 |
| JP | 2007-299608 | A | 11/2007 |
| JP | 2011-42004 | A | 3/2011 |
| JP | 2013-144349 | A | 7/2013 |
| JP | 2014233763 | A | 12/2014 |
| JP | 2017-119320 | A | 7/2017 |
| JP | 2017188030 | A | 10/2017 |
| KR | 2009105679 | A * | 10/2007 |
| KR | 20090105679 | A | 10/2009 |
| KR | 20090105679 | A * | 10/2009 ............ G05B 23/02 |
| KR | 20110092890 | A * | 8/2011 |
| KR | 101691941 | B1 * | 1/2017 |
| KR | 20170104696 | A | 9/2017 |

OTHER PUBLICATIONS

Translation KR 101691941 (Year: 2011).*
Translation KR-2009105679 Kim Jung Young (Year: 2009).*
Translation KR-20110092890 Seo Kee Hong (Year: 2011).*
Japanese Notice of Reasons for Refusal for Japanese Application No. 2017209166, dated Nov. 26, 2019 with translation, 8 pages.
Japanese Decision to Grant a Patent for Japanese Application No. 2017-209166, dated Jun. 30, 2020, with translation, 5 pages.

* cited by examiner

- JOINT A

- JOINT B

TIME TO FAILURE ANALYSIS OF ROBOTIC ARM CABLING

CROSS-REFERENCE TO RELATED APPLICATION

This application is a new U.S. Patent Application that claims benefit of Japanese Patent Application No 2017-209166, filed Oct. 30, 2017, the disclosure of this application is being incorporated herein by reference in its entirety for all purposes.

BACKGROUND OF THE INVENTION

1. Field of the Invention

The present invention relates to life prediction apparatuses and, in particular, to a life prediction apparatus which predicts the life of a cable wired at joint parts of a robot.

2. Description of the Related Art

In an articulated robot, as depicted in FIG. 8, it is required to wire a motor cable for moving each joint, a cable for driving a device attached to the robot, a signal cable to an encoder, and so forth over joint parts. These cables become fatigued by being bent or twisted with operation of each joint of the robot. With the progress of fatigue, a trouble such as a break occurs in a cable, which may lead to a halt of the robot. Therefore, it is important to predict the life of each cable and replace the cable at an appropriate time.

For prediction of the life of a component such as a bearing, a speed reducer, or the like configuring a robot, Japanese Patent Application Laid-Open Nos. 2017-119320, 2013-144349, and 09-081215 disclose techniques of calculating the life of the component to which a load is applied when the robot operates, based on history of loads. These prior art techniques use an already-established method (computational expression) for calculating the life of the bearing, the speed reducer, or the like.

On the other hand, as for life prediction of a cable wired in a robot, its life calculation method has not been established. In the field, methods are used, such as a method of using a break detecting line for making a prediction of an abnormality such as a break in a cable in advance as disclosed in Japanese Patent Application Laid-Open No. 2002-056726 and Japanese Patent Application Laid-Open Nos. 2006-126099 and 2011-42004 and a method of measuring a resistance value of a cable as disclosed in Japanese Patent Application Laid-Open No. 2007-7673.

However, in the above-described prior art techniques of detecting an abnormality of the cable, a device for detecting a break in a cable, a device for measuring a resistance value, or the like is required, thereby posing a problem of incurring cost and effort. Moreover, even if the above-described technology of predicting a life of a component of a robot is applied to a cable, methodologies as to how the life of the cable can be appropriately predicted have not been established, and it is difficult to simply use the above-described techniques for cable life prediction.

SUMMARY OF THE INVENTION

Thus, an object of the present invention is to provide a life prediction apparatus capable of accurately performing life prediction of a cable wired at joint portions of a robot.

The present invention suggests a technique of estimating a fatigue level of a cable based on operation history of the robot. In general, for a cable wired at a predetermined length at a predetermined fixed position of an articulated robot, individual variations of wiring of the cable are small. Therefore, cable behaviors can be estimated from encoder information such as the position of each axis (rotation angle of each joint) and speed. Thus, the life prediction apparatus of the present invention estimates the remaining life by estimating a fatigue level of a cable from history of the encoder information and comparing the estimated result with the result of a durability test conducted in advance.

A life prediction apparatus according to one aspect of the present invention is configured to predict a life of a cable wired over at least one joint part of a robot. The life prediction apparatus includes a fatigue-level estimation unit which estimates a fatigue level of the cable based on encoder information of an actuator which moves the joint parts.

The present invention eliminates the need for the structure of a detector or the like for predicting the life of a cable, and can thus reduce cost and effort.

BRIEF DESCRIPTION OF THE DRAWINGS

The above and other objects and features of the present invention will become apparent from the following description of exemplary embodiments with reference to the accompanying drawings in which.

DETAILED DESCRIPTION OF THE PREFERRED EMBODIMENTS

Examples of structure of a life prediction apparatus for achieving the present invention are described below.

Figure 1:
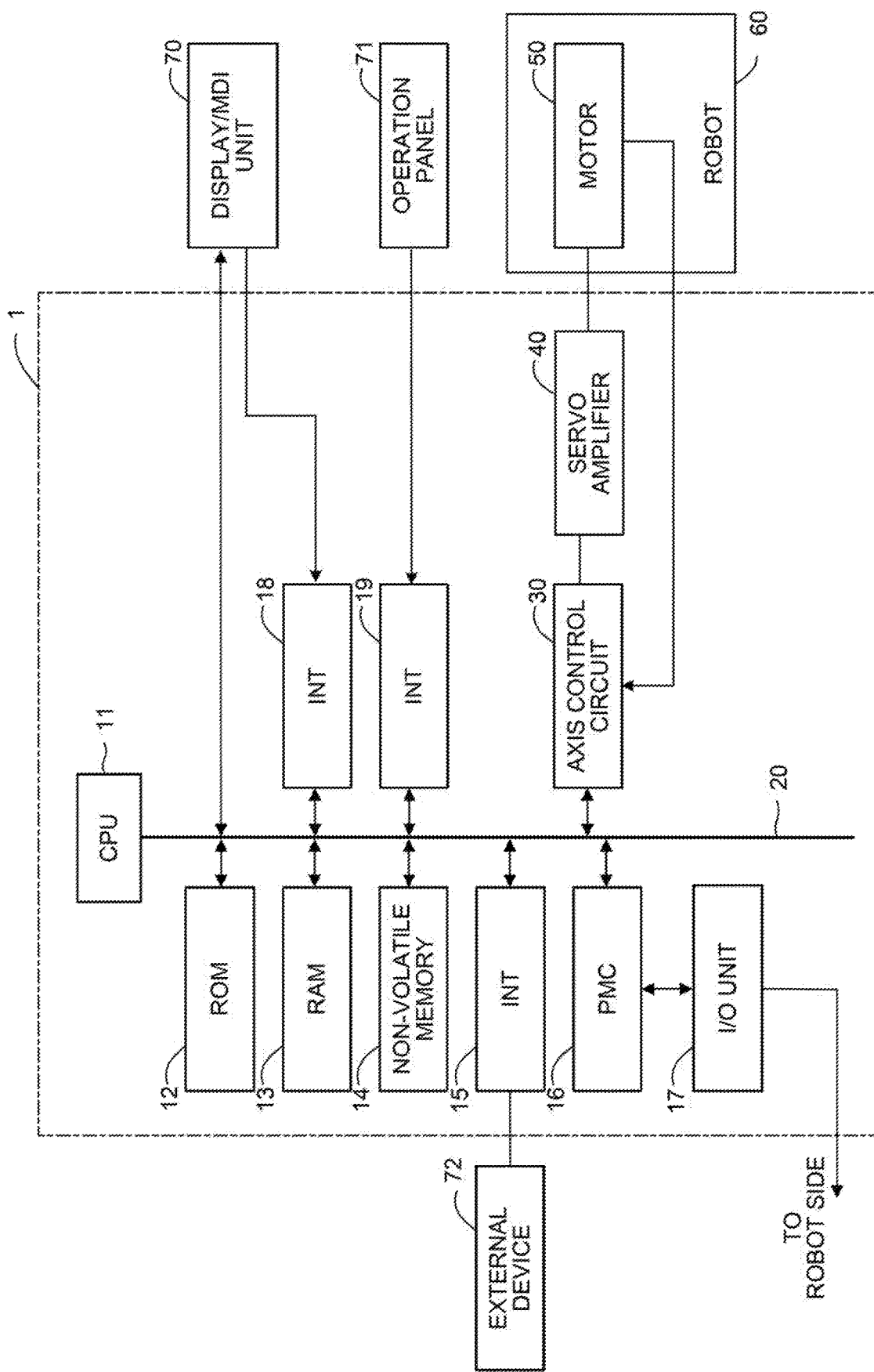
FIG. 1 is a schematic diagram of hardware structure of main parts of a life prediction apparatus according to a first embodiment.

FIG. 1 is a schematic diagram of hardware structure of main parts of a life prediction apparatus according to a first embodiment of the present invention. A life prediction apparatus 1 of the present invention can be implemented as, for example, a controller for a robot 60. The life prediction apparatus 1 of the present invention can also be implemented as, for example, a host computer, cell computer, cloud server, or the like connected to a controller of the robot 60 via a network or the like.

The life prediction apparatus 1 according to the present embodiment includes a CPU 11, which is a processor for generally controlling the life prediction apparatus 1. The CPU 11 reads a system program stored in a ROM 12 via a bus 20 to control the entire life prediction apparatus 1 in accordance with the system program. In a RAM 13, temporary computation data, display data, various data inputted by an operator via a display/MDI unit 70, which will be described further below, and so forth are stored.

A non-volatile memory 14 is configured as a memory in which a storing state is retained by, for example, being backed up by a battery not depicted, even if the life prediction apparatus 1 is powered off. The non-volatile memory 14 has stored in advance therein a control program read via an interface 15 and a control program for the robot 60 inputted via the display/MDI unit 70, which will be described further below, as well as data such as a factor for use in cable life prediction. The non-volatile memory 14 further has stored therein system programs for use in driving the control programs and so forth, and these programs are developed to the RAM 13 when executed. Also, various system programs (including a system program for a cable life prediction function) for executing, for example, process in edit mode required for creating and editing a control program have been written in the ROM 12 in advance.

The interface 15 is an interface for connecting the life prediction apparatus 1 and an external device 72 such as an adaptor. From an external device 72 side, a control program, various parameters, and so forth are read. Also, the control program edited in the life prediction apparatus 1 can be stored in external storage unit via the external device 72. By a sequence program stored in the life prediction apparatus 1, a programmable machine controller (PMC) 16 performs control by outputting a signal to a peripheral device (for example, an actuator such as a robot hand for tool replacement) of the robot 60 via an I/O unit 17. Also, upon reception of signals from various switches on an operation panel provided on a main body of the robot 60, the PMC 16 performs necessary signal processing, and then passes the resultant signal to the CPU 11.

The display/MDI unit 70 is a manual data input device including a display, keyboard, and so forth. An interface 18 receives an instruction and data from the keyboard of the display/MDI unit 70, and passes them to the CPU 11. An interface 19 is connected to an operation panel 71 including, for example, a manual pulse generator for use in manually driving each axis.

An axis control circuit 30 for controlling a motor 50 as an actuator which moves each joint of the robot 60 receives an axis movement instruction amount (rotation amount) from the CPU 11, and outputs an axis instruction to a servo amplifier 40. Upon reception of this instruction, the servo amplifier 40 drives the motor 50 provided in the robot 60. The motor 50 as an actuator has incorporated therein an encoder which detects a position and speed, and feeds back encoder information for feeding back the position and speed from this encoder to the axis control circuit 30, thereby performing feedback control over the position and speed. Although the hardware structure diagram of FIG. 1 depicts only one axis control circuit 30, one servo amplifier 40, and one motor 50, they are each prepared, in practice, as many as the number of joints (for example, six) provided to the robot 60 as a control target.

Figure 2:
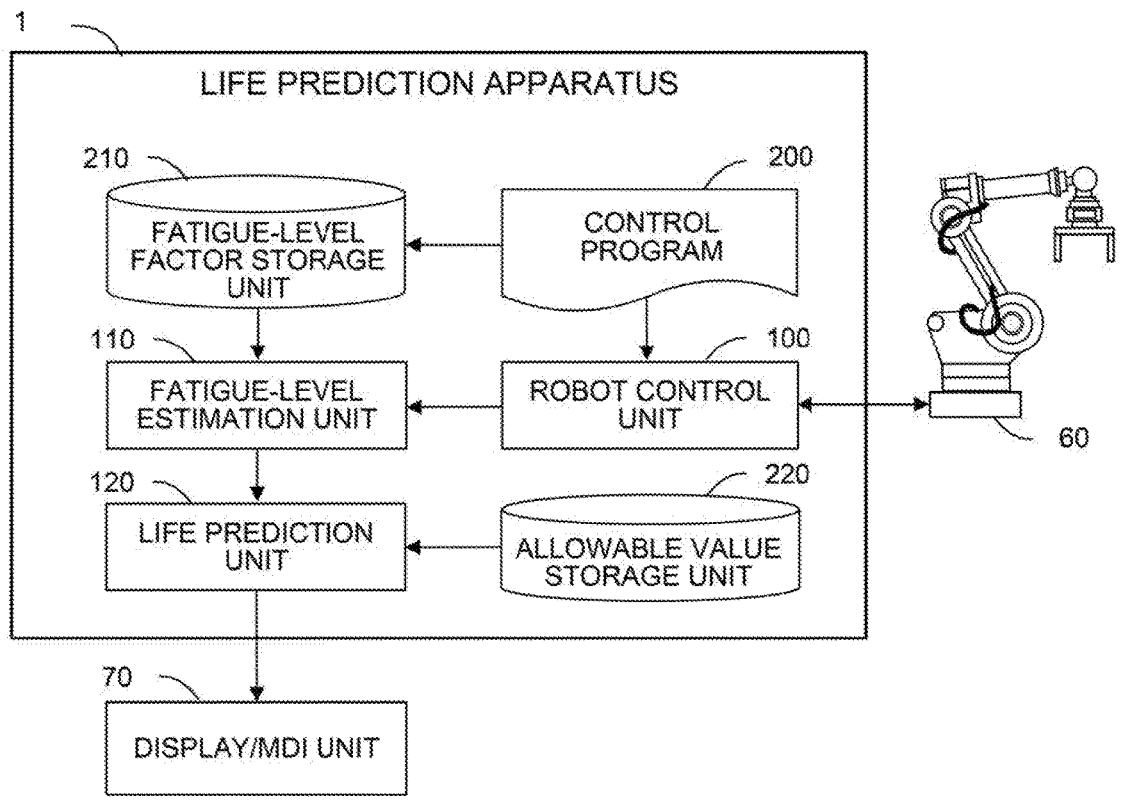
FIG. 2 is a schematic functional block diagram of the life prediction apparatus according to the first embodiment.

FIG. 2 is a schematic functional block diagram of the life prediction apparatus 1 according to one embodiment of the present invention when the system program for achieving the life prediction function is implemented in the life prediction apparatus 1 depicted in FIG. 1. Each functional block depicted in FIG. 2 is achieved by the CPU 11 provided in the life prediction apparatus 1 depicted in FIG. 1 executing the system program of the life prediction function and controlling the operation of each unit of the life prediction apparatus 1. The life prediction apparatus 1 of the present embodiment includes a robot control unit 100, a fatigue-level estimation unit 110, and a life prediction unit 120. The robot control unit 100 controls the robot 60 based on a control program 200. The fatigue-level estimation unit 110 estimates a fatigue level of a cable wired over the respective joints of the robot 60 based on the encoder information received from the robot control unit 100 and fed back from the motors 50 for moving the respective joints of the robot 60. And the life prediction unit 120 predicts the life of the cable based on the fatigue level of the cable estimated by the fatigue-level estimation unit 110 and an allowable value indicating durability of the cable.

The robot control unit 100 controls the motors 50 for moving the respective joints of the robot 60 based on the control program 200, and also outputs the encoder information fed back from the motors 50 to the fatigue-level estimation unit 110. The encoder information fed back from each motor 50 includes information about the position and speed of that motor 50.

The fatigue-level estimation unit 110 estimates a fatigue level of the cable based on the position of the motor 50 included in the encoder information of the motor 50 which moves each joint of the robot 60 received from the robot control unit 100. When calculating a fatigue level of the cable based on the position of the motor 50, the fatigue-level estimation unit 110 uses a position weighting factor $K1(\theta)$ stored in advance in a fatigue-level factor storage unit 210, which is a storage region provided on a memory such as the non-volatile memory 14.

Figure 3:
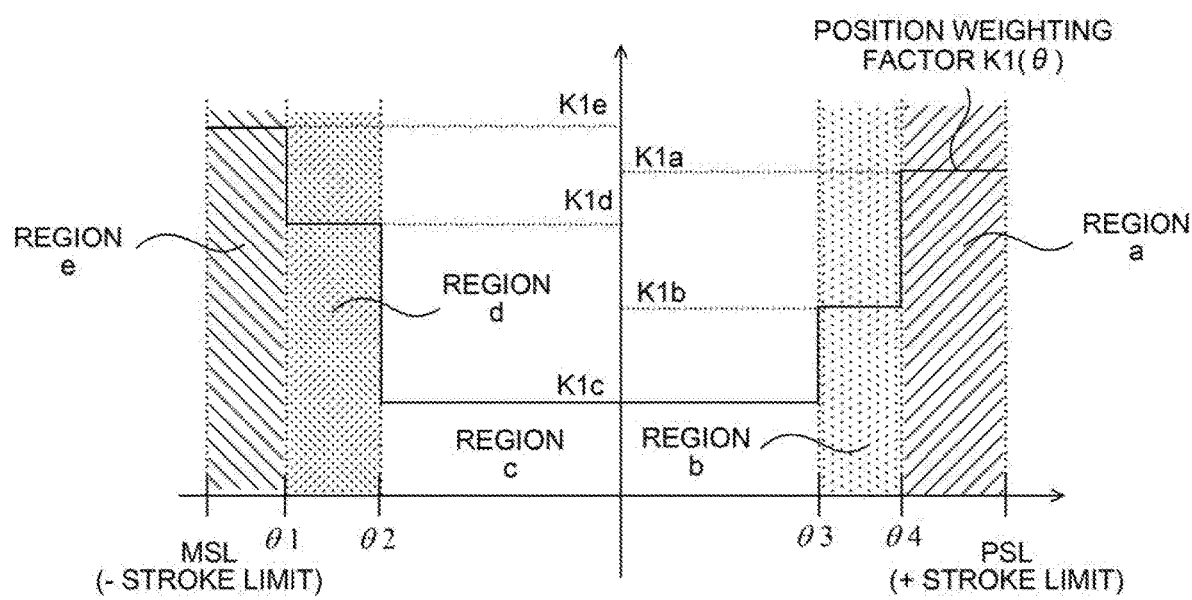
FIG. 3 is a diagram exemplarily depicting a position weighting factor $K1(\theta)$.

FIG. 3 is a diagram for describing an example of the position weighting factor $K1(\theta)$. The position weighting factor $K1(\theta)$ is a factor indicating the magnitude of a twisting amount or bending amount applied to the cable when the motor 50 which moves the joints of the robot 60 is at the position $\theta$. As depicted in FIG. 3, the position weighting factor $K1(\theta)$ varies in accordance with the position $\theta$ (rotation angle) of the motor 50 which moves the joints of the robot 60. In the example depicted in FIG. 3, the motor 50 which moves the joints of the robot 60 can be positioned in any of five regions a to e and position weighting factors in the regions where the motor 50 can be positioned are assumed to be $K1_a$ to $K1_e$.

While the position weighting factor $K1(\theta)$ may be set as a function which returns a stepwise value with respect to the position $\theta$ of the motor 50 described above, this is not meant to be restrictive, and the position weighting factor $K1(\theta)$ may be set as a function which returns a successively changing value with respect to the position $\theta$ of the motor 50.

The position weighting factor $K1(\theta)$ is determined by conducting, for example, a cable durability test for causing the joints to perform stroke motion, in a situation where the cable is wired to the robot 60 in advance. For example, as depicted in FIG. 3, when the position weighting factor $K1(\theta)$ is defined as a function which returns a stepwise value in accordance with the position $\theta$ (rotation angle) of the motor 50 which moves the joints of the robot 60, in addition to a full-stroke test to respective joints of the robot 60, a local cable durability test is performed in each of the regions a to e. This allows the position weighting factor $K1(\theta)$ to be found as a function which returns a relative value with reference to, for example, the position weighting factor (for example, 1) in the region c. The position weighting factor $K1(\theta)$ found by an experiment as described above is stored in the fatigue-level factor storage unit 210, which is a storage region provided on the memory of the life prediction apparatus 1, and is used by the fatigue-level estimation unit 110.

Figure 4:
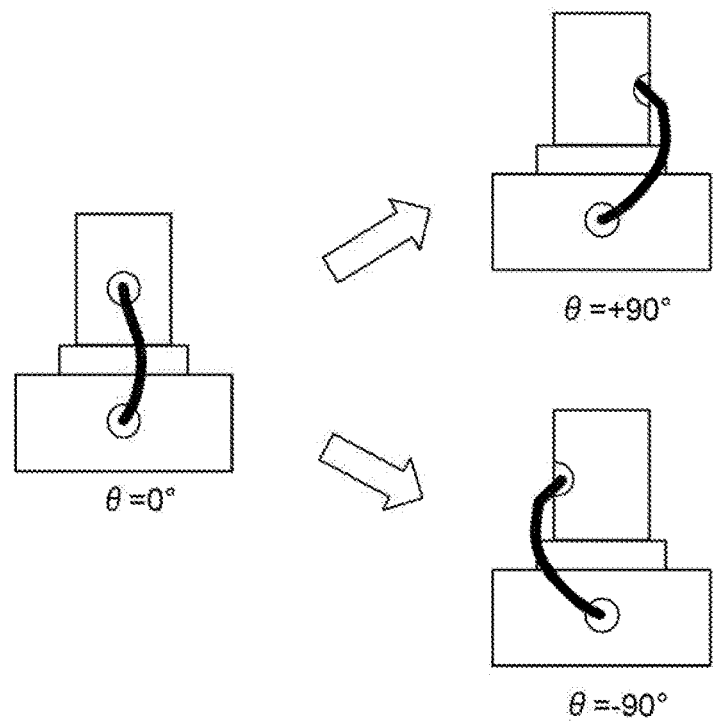
FIG. 4 is a diagram for describing a relation between a position of a motor which moves a joint and a twisting amount or bending amount of a cable.
Figure 4:
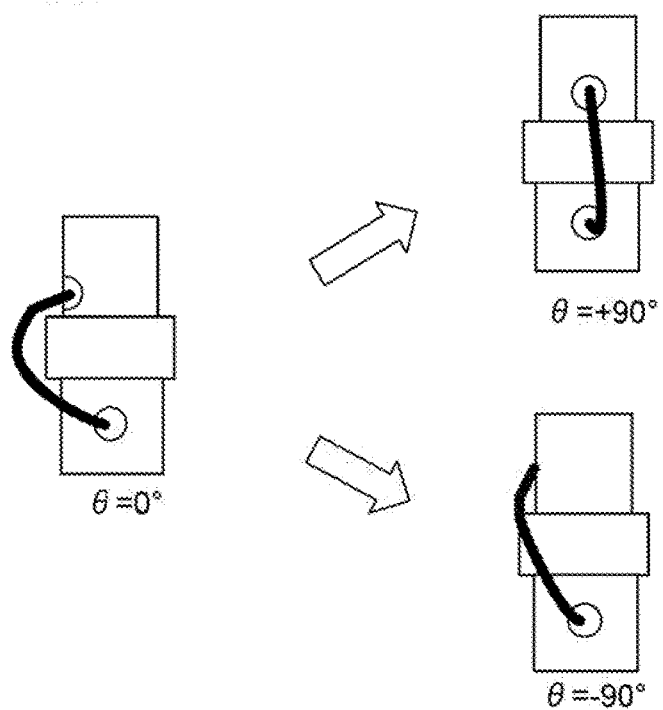

The position weighting factor $K1(\theta)$ is prepared for each joint of the robot 60. This is because each joint of the robot 60 has a different stroke limit, a different moving speed, a different cable wiring across each joint, and so forth. For example, as depicted in FIG. 4, in cable wiring for a joint A, the twisting amount or the bending amount applied to the cable is minimum when the position $\theta$ of the motor 50 which moves the joint is at 0 degrees, and therefore the position weighting factor $K1(\theta)$ has a small value. However, the twisting amount or the bending amount applied to the cable when the position $\theta$ is at +90 degrees or −90 degrees is larger than that when the position $\theta$ is at 0 degrees, and therefore the position weighting factor $K1(\theta)$ has a large value.

On the other hand, in cable wiring for a joint B depicted in FIG. 4, the twisting amount or the bending amount applied to the cable when the position $\theta$ of the motor 50 which moves the joint is at +90 degrees are smaller than those when the position $\theta$ is at 0 degrees, and therefore the position weighting factor $K1(\theta)$ has a small value. In this manner, the position weighting factor $K1(\theta)$ is varied depending on the state of each joint (in particular, cable wiring state), and it is therefore required to prepare the position weighting factor $K1(\theta)$ for each joint of the robot 60.

Figure 5:
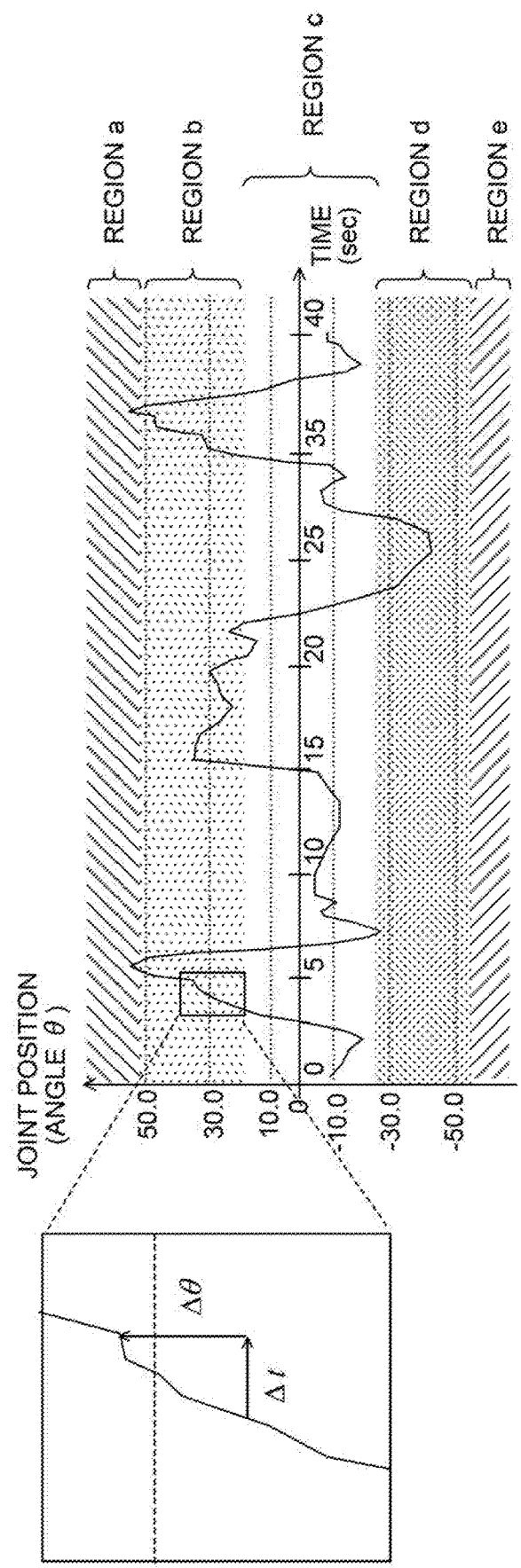
FIG. 5 is a diagram for describing a method of estimating a fatigue level of the cable.

The fatigue-level estimation unit 110 estimates a fatigue level of the cable for each joint of the robot 60. More specifically, as depicted in FIG. 5, the fatigue-level estimation unit 110 adds up values each acquired by multiplying an absolute value of a movement amount $\Delta\theta$ (angular displacement) of the motor 50 per unit time $\Delta t$ for each joint by the position weighting factor $K1(\theta)$ at the position of the motor 50, from the start of using the cable, thereby estimating a fatigue level of the cable at that joint (Equation (1)), and outputs the estimated fatigue level of the cable to the life prediction unit 120.

$$\text{Fatigue level of cable} = \sum_t K1(\theta) \times |\Delta\theta| \tag{1}$$

The life prediction unit 120 predicts the life of the cable for each joint of the robot 60 based on the fatigue level of the cable inputted from the fatigue-level estimation unit 110 and an allowable value C indicating durability of the cable stored in advance in an allowable value storage unit 220. The allowable value C indicating durability of the cable stored in the allowable value storage unit 220 is determined as a value acquired by conducting a cable durability test or the like in advance and taking the position weighting factor $K1(\theta)$ into consideration. Based on the fatigue level of the cable and the allowable value C, the life prediction unit 120 calculates the life of the cable by using the following Equation (2).

$$\text{Life of cable (\%)} = \left(1 - \frac{\sum_t K1(\theta) \times |\Delta\theta|}{C}\right) \times 100 \tag{2}$$

The life prediction unit 120 may causes the life of the cable for each joint of the robot 60 predicted in response to a request from an operator to be displayed on the display/MDI unit 70. Also, when any life of the cable at each joint of the robot 60 exceeds a predetermined threshold (for example, 90%) defined in advance, the life prediction unit 120 may sound an alarm or indicate, on the display/MDI unit 70, to the effect that it is time to replace the cable.

As a modification example of the life prediction unit 120 of the present embodiment, the fatigue-level estimation unit 110 may calculate a fatigue level of the cable by using the operation speed of the motor 50 included in the encoder information, in addition to the position of the motor 50. In this case, the fatigue-level estimation unit 110 uses a speed weighting factor $K2(\omega)$ stored in advance in the fatigue-level factor storage unit 210, which is a storage region provided on the memory such as the non-volatile memory 14.

The speed weighting factor $K2(\omega)$ is a factor indicating the magnitude of change of the twisting amount or the bending amount applied to the cable when the motor 50 which moves the joints of the robot 60 moves at a speed $\omega$, and is varied in accordance with the speed $\omega$ (angular velocity) of the motor 50 which moves the joints of the robot 60. In general, a cable wired across the joint of the robot 60 tends to become fatigued more as the magnitude of change of the twisting amount or the bending amount applied to that cable per unit time is increased. Thus, the speed weighting factor $K2(\omega)$ is defined so as to indicate a higher value as the speed $\omega$ (angular velocity) of the motor 50 which moves the joints of the robot 60 is increased, and thus defined speed weighting factor $K2(\omega)$ is used, thereby allowing estimation of a fatigue level with higher accuracy. As with the position weighting factor $K1(\theta)$, the speed weighting factor $K2(\omega)$ may be set as a function which returns a stepwise value with respect to the speed $\omega$ of the motor 50, or may be set as a function which returns a successively changing value with respect to the speed $\omega$ of the motor 50.

As with the position weighting factor $K1(\theta)$, the speed weighting factor $K2(\omega)$ is determined by conducting, for example, a cable durability test for causing the joint to perform stroke motion at a predetermined speed with the cable being wired to the robot 60 in advance. The speed weighting factor $K2(\omega)$ found by an experiment as described above is stored in the fatigue-level factor storage unit 210, which is a storage region provided on the memory of the life prediction apparatus 1, and is used by the fatigue-level estimation unit 110.

When estimating a fatigue level of the cable by using both of the position and the speed of the motor 50 which moves the joints of the robot 60, the fatigue-level estimation unit 110 estimates a fatigue level of the cable by using the following Equation (3) based on the position and speed included in the encoder information.

$$\text{Fatigue level of cable} = \sum_t K1(\theta) \times K2(\omega) \times |\Delta\theta| \tag{3}$$

According to the above-described modification example, the life of the cable wired over the joint of the robot 60 is predicted based on the position and the speed of the motor 50 as an actuator which moves that joint. Therefore, it is possible to predict the life of the cable with higher accuracy.

Figure 6:
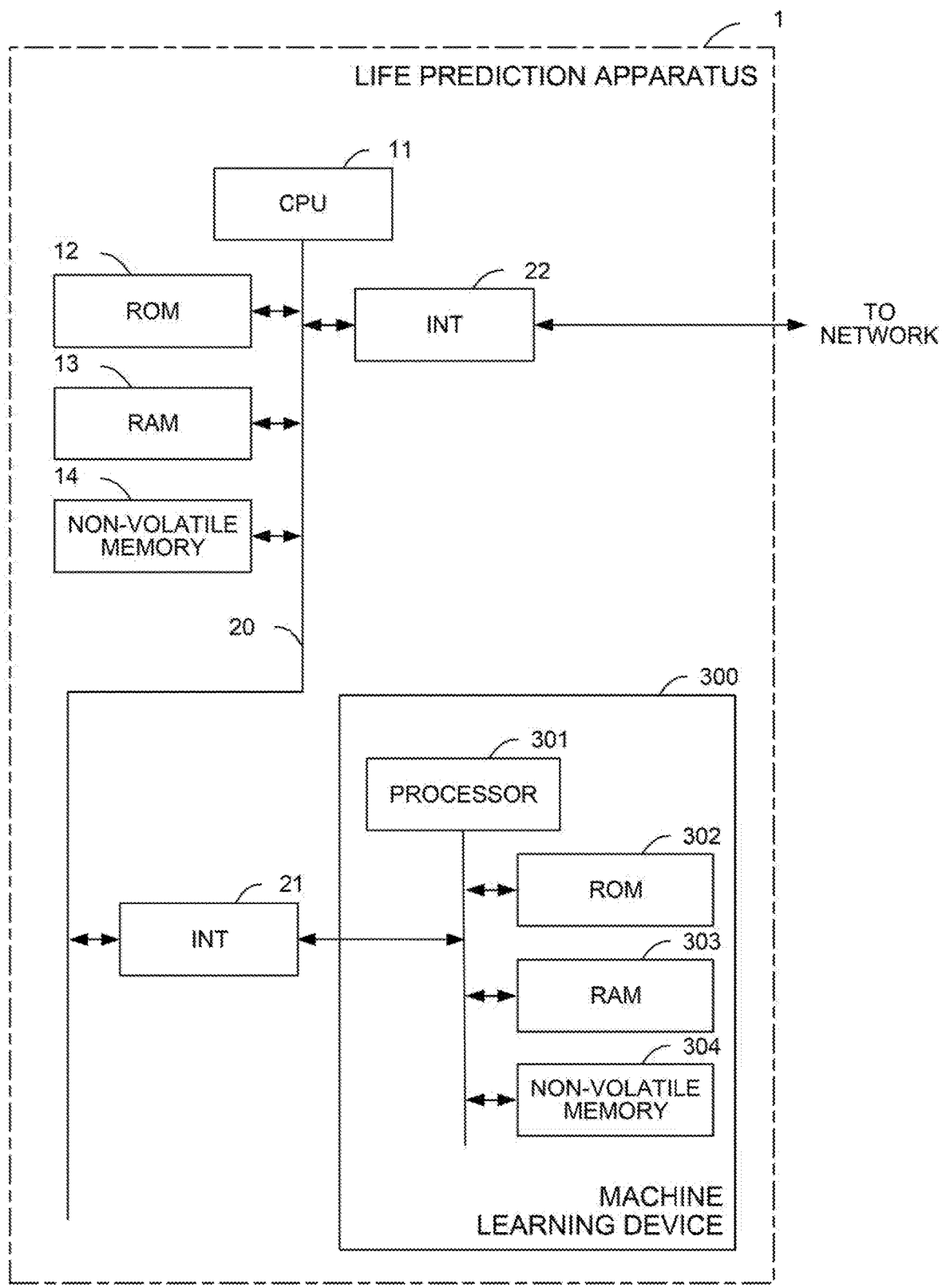
FIG. 6 is a schematic diagram of hardware structure of main parts of a life prediction apparatus according to a second embodiment.

FIG. 6 is a schematic diagram of hardware structure of main parts of a life prediction apparatus according to a second embodiment of the present invention. The life prediction apparatus 1 of the present embodiment can be implemented as, for example, a host computer, cell computer, cloud server, or the like connected to controllers of a plurality of robots 60 of the same type via a network or the like. The basic function of each of the CPU 11, the ROM 12, the RAM 13, and the non-volatile memory 14, which are provided in the life prediction apparatus 1, is similar to that described with reference to FIG. 1.

The life prediction apparatus 1 according to the present embodiment has a function of receiving, via an interface 22, data collected from a controller of each robot 60 connected via a network and estimating the position weighting factor K1(θ) and the allowable value C of the cable based on the received data. The life prediction apparatus 1 includes a machine learning apparatus 300 which estimates the position weighting factor K1(θ) and the allowable value C of the cable based on the data collected from the controller of the robot 60.

An interface 21 is an interface for connecting the life prediction apparatus 1 and the machine learning apparatus 300. The machine learning apparatus 300 includes a processor 301 which controls the entire machine learning apparatus 300, a ROM 302 having a system program and so forth stored therein, a RAM 303 for temporary storage in each process regarding machine learning, and a non-volatile memory 304 for use in storage of a learning model and so forth. The machine learning apparatus 300 can observe each piece of information that can be acquired in the life prediction apparatus 1 via the interface 21 (such as data collected from the controller of the robot 60). Also, upon reception of estimated values of the position weighting factor K1(θ) and the allowable value C of the cable outputted from the machine learning apparatus 300, the life prediction apparatus 1 updates the position weighting factor K1(θ) stored in the fatigue-level factor storage unit 210, which will be described further below, and the allowable value C of the cable stored in the allowable value storage unit 220, which will be described further below.

Figure 7:
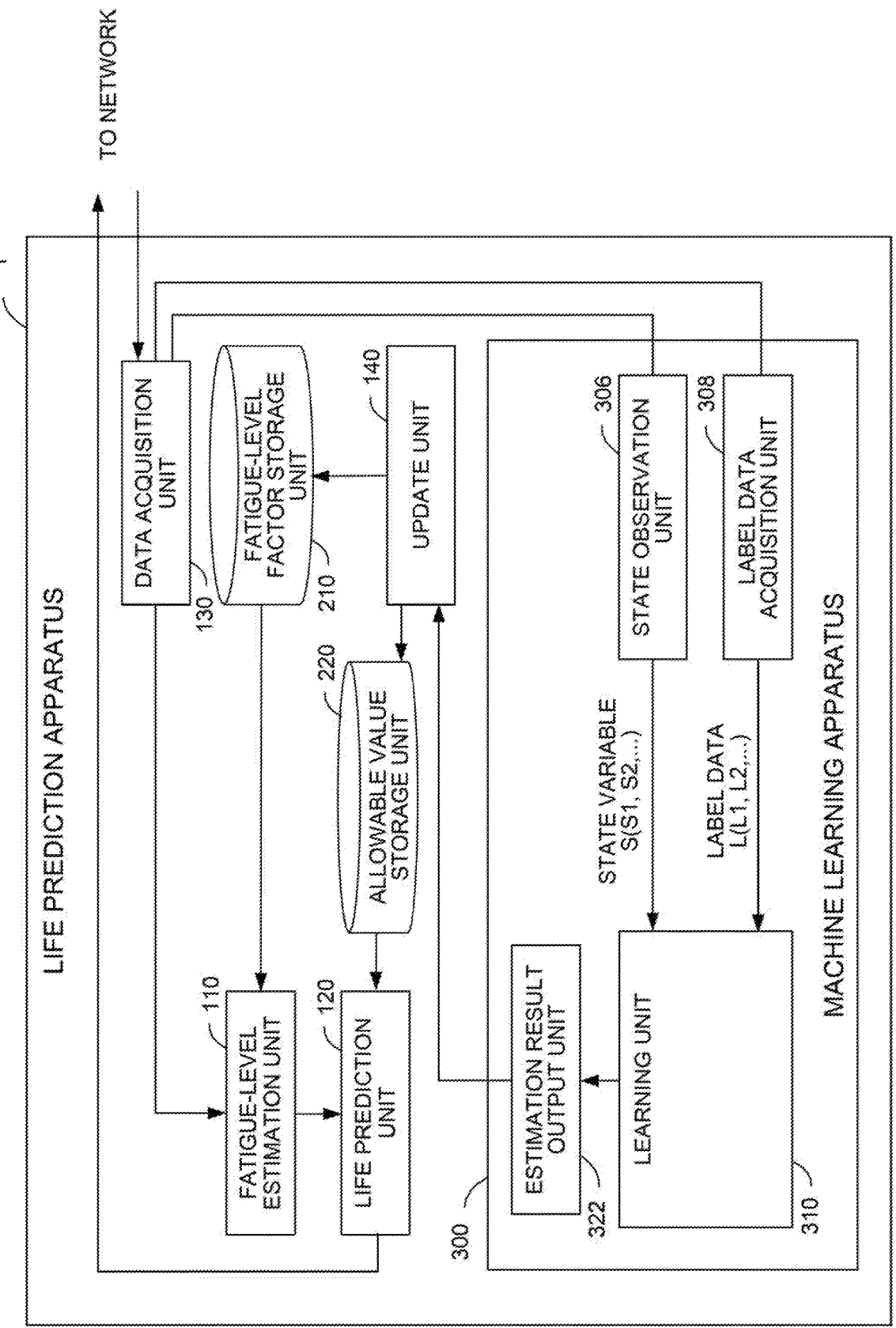
FIG. 7 is a schematic functional block diagram of the life prediction apparatus according to the second embodiment.
Figure 8:
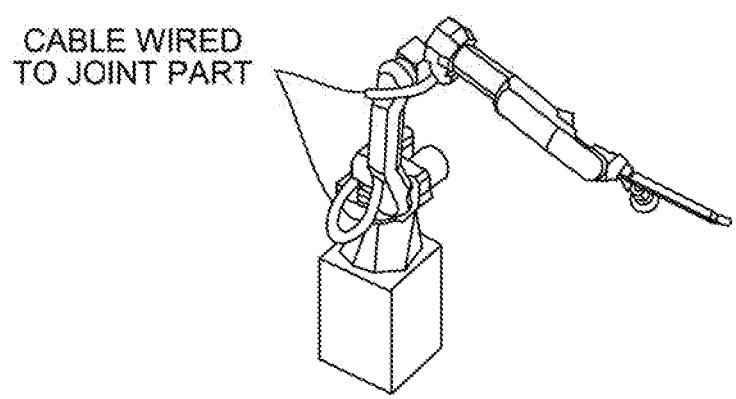
FIG. 8 is a diagram for exemplarily depicting a cable wired over joints of a robot.

FIG. 7 is a schematic functional block diagram of the life prediction apparatus 1 and the machine learning apparatus 300 according to the present embodiment. Each functional block depicted in FIG. 7 is implemented by the CPU 11 provided in the life prediction apparatus 1 and the processor 301 of the machine learning apparatus 300 depicted in FIG. 6 each executing a system program to control the operation of each unit of the life prediction apparatus 1 and the machine learning apparatus 300.

The life prediction apparatus 1 of the present embodiment performs cable life prediction in a manner similar to that of the first embodiment based on the encoder information of the motor 50 about each joint of the robot 60 acquired by the data acquisition unit 130 from the controller of the robot 60 via a network, and transmits the prediction result to the controller of the robot 60 via the network. Also, based on history of the encoder information of the motor 50 about each joint of the robot 60 acquired by the data acquisition unit 130 from controllers of a plurality of robots 60 and time information when the cable reaches its end of life and is actually replaced, the life prediction apparatus 1 of the present embodiment learns the position weighting factor K1(θ) or the allowable value C of the cable, and also estimates the position weighting factor K1(θ) or the allowable value C of the cable based on the learning results and updates the position weighting factor K1(θ) stored in the fatigue-level factor storage unit 210 or the allowable value C of the cable stored in the allowable value storage unit 220 based on the estimation results.

The data acquisition unit 130 provided in the life prediction apparatus 1 of the present embodiment acquires, from the controller of each of the robots 60 of the same type via the network, encoder information of the motor 50 about each joint of the robot 60, and outputs the encoder information to the fatigue-level estimation unit 110. Also, the data acquisition unit 130 accumulates, as history, the encoder information of the motor 50 about each joint of the robot 60 acquired from the controllers of the plurality of robots 60 on the memory of the non-volatile memory 14 or the like, and acquires maintenance information regarding cable replacement in each robot 60 (in general, inputted by an operator who performs maintenance to the controller of the robot 60) and stores the maintenance information on the memory such as the non-volatile memory 14. And, the data acquisition unit 130 outputs history of the encoder information accumulated on the memory and acquired from the controllers of the plurality of robots 60 and the maintenance information of the cable to the machine learning apparatus 300.

Meanwhile, the machine learning apparatus 300 provided in the life prediction apparatus 1 includes software (such as a learning algorithm) and hardware (such as the processor 301) for learning, by itself via so-called machine learning, estimation of the position weighting factor K1(θ) for use in cable fatigue-level estimation or the allowable value C of the cable for use in cable life prediction, with respect to an operation state of the motor 50 for each joint of the robot 60. In the machine learning apparatus 300 of the present embodiment, the position weighting factor K1(θ) or the allowable value C of the cable for use in cable life prediction provisionally defined based on the results of a durability test or the like is learned in advance. Then, the position weighting factor K1(θ) or the allowable value C of the cable for use in cable life prediction is estimated based on the history of the operation state of the motor 50 of the robot 60 actually being used in the field, and estimation of the position weighting factor K1(θ) or the allowable value C of the cable for use in cable life prediction is learned based on the history of the operation state of the motor 50 of the robot 60 actually being used in the field and the life of the cable acquired by maintenance work in the field (that cable can be assumed to reach its end of life at the time of cable replacement) (that is, an error in estimation of the position weighting factor K1(θ) or the allowable value of the cable C for use in cable life prediction already learned is corrected). In the machine learning apparatus 300 of the present embodiment, when this apparatus is used as a machine learning apparatus which estimates and learns the position weighting factor K1(θ), as for the allowable value C of the cable for use in cable life prediction, a provisionally defined value is first handled as a determined value. When this apparatus is used as a machine learning apparatus which estimates and learns the allowable value C of the cable for use in cable life prediction, as for the position weighting factor K1(θ), a provisionally defined value is first handled as a determined value. What is learned by the machine learning apparatus 300 provided in the life prediction apparatus 1 corresponds to a model structure representing a correlation between the operation state of each joint of the robot 60 and the position weighting factor K1(θ) or the allowable value C of the cable.

As depicted by using functional blocks in FIG. 7, the machine learning apparatus 300 provided in the life prediction apparatus 1 includes a state observation unit 306, a label data acquisition unit 308, a learning unit 310, and an estimation result output unit 322. The state observation unit 306 observes, a state variable S representing a current environmental state, operation state data S1 indicating an operation state of the motor 50 for each joint of the robot 60. The label data acquisition unit 308 acquires label data L including either of position weighting factor data L1 or cable allowable value data L2 roughly estimated from the operation state of the motor 50 for each joint of the robot 60 and the maintenance information regarding cable replacement in the robot 60. The learning unit 310 learns estimation of the position weighting factor K1(θ) or the allowable value C of the cable with respect to the operation state of the motor 50 for each joint of the robot 60 based on the state variable S and the label data L. And the estimation result output unit 322 outputs the position weighting factor K1(θ) or the allowable value C of the cable estimated from the operation state of the motor 50 for each joint of the robot 60 by using the model learned by the learning unit 310.

In a case where the position of the motor 50 for each joint of the robot 60 is divided into a plurality of regions in advance as depicted in FIG. 3, the operation state S1 among the state variable S observed by the state observation unit 306 can be acquired as an accumulation value of movement amounts in the respective regions. The way of dividing the position of the motor 50 for each joint of the robot 60 into a plurality of regions is not specifically limited, but it is sufficient to divide the position of the motor 50 into regions in accordance with the degree of fineness of the position weighting factor K1(θ) to be estimated and acquire, for each of the regions thus divided, an accumulated value of movement amounts of the motor 50 in the region. Also, when the position weighting factor K1(θ) is a function which returns a successive value with respect to the position θ of the motor 50, it is sufficient to divide the position of the motor 50 into regions each having a certain level of fineness (for example, each 5 degrees) and acquire, for each of the regions thus divided, an accumulated value of movement amounts of the motor 50 in the region.

At the time of learning by the learning unit 310, the label data acquisition unit 308 acquires, as the label data L from the data acquisition unit 130, the position weighting factor data L1 or the cable allowable value data L2 roughly estimated from the operation state of the motor 50 for each joint of the robot 60 and a period from a time when the cable is started to be used in the robot 60 to a time when the cable is replaced. The label data acquisition unit 308 is used at the time of learning by the learning unit 310, and is not required to be an indispensable structure for the machine learning apparatus 300 after learning by the learning unit 310 is completed.

By following any learning algorithm generally referred to as machine learning, the learning unit 310 learns the label data L (the position weighting factor data L1 or the cable allowable value data L2) with respect to the state variable S (the operation state data S1 indicating the operation state of the motor 50 for each joint of the robot 60). The learning unit 310 can learn, for example, a correlation between the operation state data S1 included in the state variable S and the position weighting factor data L1 or the cable allowable value data L2 included in the label data L. The learning unit 310 can repeatedly conduct learning based on a data set including the state variable S and the label data L.

In learning by the learning unit 310, a plurality of learning cycles are desirably performed based on the data acquired from the controllers of the plurality of robots 60 of the same type. By repeatedly performing this learning cycle, the learning unit 310 automatically interprets the correlation between the operation state of each joint of the robot 60 (the operation state data S1) and the factor for use in estimation of a fatigue level of the cable or the cable allowable value for use in life prediction (the position weighting factor data L1 or the cable allowable value data L2). At the start of the learning algorithm, the correlation of the position weighting factor data L1 or the cable allowable value data L2 with respect to the operation state data S1 is substantially unknown. However, as the learning unit 310 conducts learning, the correlation of the position weighting factor data L1 or the cable allowable value data L2 with respect to the operation state data S1 is gradually interpreted, and a learned model acquired as a result is used, thereby allowing interpretation of the correlation of the position weighting factor data L1 or the cable allowable value data L2 with respect to the operation state data S1.

Based on the results learned by the learning unit 310 (learned model), the estimation result output unit 322 estimates, from the operation state of each joint of the robot 60 acquired from the controller of the robot 60, a factor for use in estimation of a fatigue level of the cable or a cable allowable value for use in life prediction, and outputs the estimated factor for use in estimation of a fatigue level of the cable or cable allowable value for use in life prediction.

Then, based on the factor for use in estimation of a fatigue level of the cable or the cable allowable value for use in life prediction outputted from the estimation result output unit 322, an update unit 140 updates the position weighting factor K1(θ) stored in the fatigue-level factor storage unit 210 or the allowable value C of the cable stored in the allowable value storage unit 220.

In the above-structured machine learning apparatus 300, the learning algorithm to be executed by the learning unit 310 is not particularly restrictive, and any known learning algorithm can be adopted as machine learning.

While the embodiments of the present invention have been described above, the present invention is not restricted to only the examples of the above-described embodiments, and can be implemented in various modes by adding modifications as appropriate.

The invention claimed is:

1. A life prediction apparatus which predicts a life of a cable wired over at least one joint part of a robot, the life prediction apparatus comprising:
   a processor configured to:
      control a motor to move a joint of a robot,
      determine a plurality of angular positions of the motor indicated by an encoder at a plurality of time points,
      determine a plurality of predetermined position weighting factors corresponding to the determined angular positions of the motor, the predetermined position weighting factors indicate an amount of twisting or bending of the cable at the determined angular positions of the motor,
      determine a plurality of angular displacements indicating a difference in the angular positions between the time points, and
      estimate a fatigue level of the cable by accumulating the angular displacements and the corresponding position weighting factors over a time period.

2. The life prediction apparatus according to claim 1, wherein the processor is further configured to:
   determine a speed of the motor indicated by the encoder, and
   estimate the fatigue level of the cable by further using a second weighting factor set in accordance with the speed of the motor.

3. The life prediction apparatus according to any one of claim 1, wherein the processor is further configured to:
   predict the life of the cable based on the fatigue level of the cable estimated and an allowable value of the cable determined in advance.

4. The life prediction apparatus according to claim 3, wherein the processor is further configured to:

perform machine learning to estimate the allowable value of the cable.

5. The life prediction apparatus according to claim 1, wherein the processor is further configured to:

perform machine learning to estimate the first weighting factor.

* * * * *